United States Patent
Barbato

(10) Patent No.: US 10,713,116 B2
(45) Date of Patent: Jul. 14, 2020

(54) SOLID STATE DEVICE IMPLEMENTING DYNAMIC POLAR ENCODING

(71) Applicant: Sabrina Barbato, Turate (IT)

(72) Inventor: Sabrina Barbato, Turate (IT)

(*) Notice: Subject to any disclaimer, the term of this patent is extended or adjusted under 35 U.S.C. 154(b) by 0 days.

(21) Appl. No.: 16/211,745

(22) Filed: Dec. 6, 2018

(65) Prior Publication Data

US 2020/0183780 A1 Jun. 11, 2020

(51) Int. Cl.
*G06F 11/10* (2006.01)
*H03M 13/13* (2006.01)
*G11C 29/52* (2006.01)

(52) U.S. Cl.
CPC .......... *G06F 11/1068* (2013.01); *G11C 29/52* (2013.01); *H03M 13/13* (2013.01)

(58) Field of Classification Search
CPC ..... G06F 11/1068; G11C 29/52; H03M 13/13
See application file for complete search history.

(56) References Cited

U.S. PATENT DOCUMENTS

| | | | | |
|---|---|---|---|---|
| 10,049,764 B2* | 8/2018 | Huang | | H03M 13/13 |
| 2014/0095110 A1* | 4/2014 | Chen | | G11C 29/028 |
| | | | | 702/179 |
| 2014/0301142 A1* | 10/2014 | Stoev | | G11C 16/3454 |
| | | | | 365/185.09 |
| 2016/0239235 A1* | 8/2016 | Chung | | G06F 3/0629 |
| 2017/0111060 A1* | 4/2017 | Huang | | H03M 13/13 |
| 2019/0198099 A1* | 6/2019 | Mirichigni | | G11C 13/003 |

OTHER PUBLICATIONS

J. Bian, S. Zhao and L. Kong, "Rate-adaptive Polar Codes Design for MLC NAND Flash Memory," 2018 IEEE 4th International Conference on Computer and Communications (ICCC), Chengdu, China, 2018, pp. 11-16. (Year: 2018).*

K. Mizoguchi, T. Takahashi, S. Aritome and K. Takeuchi, "Data-Retention Characteristics Comparison of 2D and 3D TLC NAND Flash Memories," 2017 IEEE International Memory Workshop (IMW), Monterey, CA, 2017, pp. 1-4. (Year: 2017).*

(Continued)

*Primary Examiner* — Cynthia Britt
(74) *Attorney, Agent, or Firm* — John M. Janeway; Janeway Patent Law, PLLC

(57) ABSTRACT

A method for operating a solid state storage device comprising memory cells exhibiting respective threshold voltage distributions comprises: providing sets of frozen bits each one associated with a respective RBER estimate being estimated according to a respective shape of the threshold voltage distributions; determining a current value of operative parameter(s) affecting the shape of the threshold voltage distributions; based on the current value of the operative parameter(s), determining a current shape of the threshold voltage distributions; determining a current RBER estimate associated with the current shape of the threshold voltage distributions; selecting a current set of frozen bits associated with the current RBER estimate; encoding the information bits and the current set of frozen bits with a polar code; storing the polar encoded bits in selected memory cells; reading the stored polar encoded bits, and decoding them according to said current set of frozen bits.

33 Claims, 9 Drawing Sheets

(56) References Cited

OTHER PUBLICATIONS

Arikan, "Channel polarization: A method for constructing capacity-achieving codes for symmetric binary-input memoryless channels", IEEE Trans. Inf. Theory, 2009, vol. 55, No. 7, pp. 3051-3073
C. Z Hang, B. Yuan, K. K. Parhi, "Reduced-latency sc polar decoder architectures", Proceedings of IEEE International Conference on Communications (ICC), 2012, pp. 3471-3475.
C. Z Hang, K. K. Parhi, "Low-latency sequential and overlapped architectures for successive cancellation polar decoder", IEEE Trans. Signal Process., 2013, vol. 61, No. 10, pp. 2429-2441.
E. Arikan. "A Performance Comparison of Polar Codes and Reed-Muller Codes", IEEE Communications Letters vol. 12 No. 6, Jun. 2008.
H. Li and J. Yuan. "A practical construction method for Polar Codes in AWGN channels", TENCON Spring Conference, Sydney, NSW, Apr. 2013.
E. Sasoglu and L. Wang, "Universal polarization," IEEE International Symposium on Information Theory (ISIT), Honolulu, HI, Jun. 2014.
S. H. Hassani and R. Urbanke, "Universal polar codes", IEEE International Symposium on Information Theory (ISIT), Honolulu, HI, Jun. 2014.
M. Alsan, "Universal polar decoding with channel knowledge at the encoder", IEEE Information Theory Workshop (ITW), Hobart, Australia, 2014.

\* cited by examiner

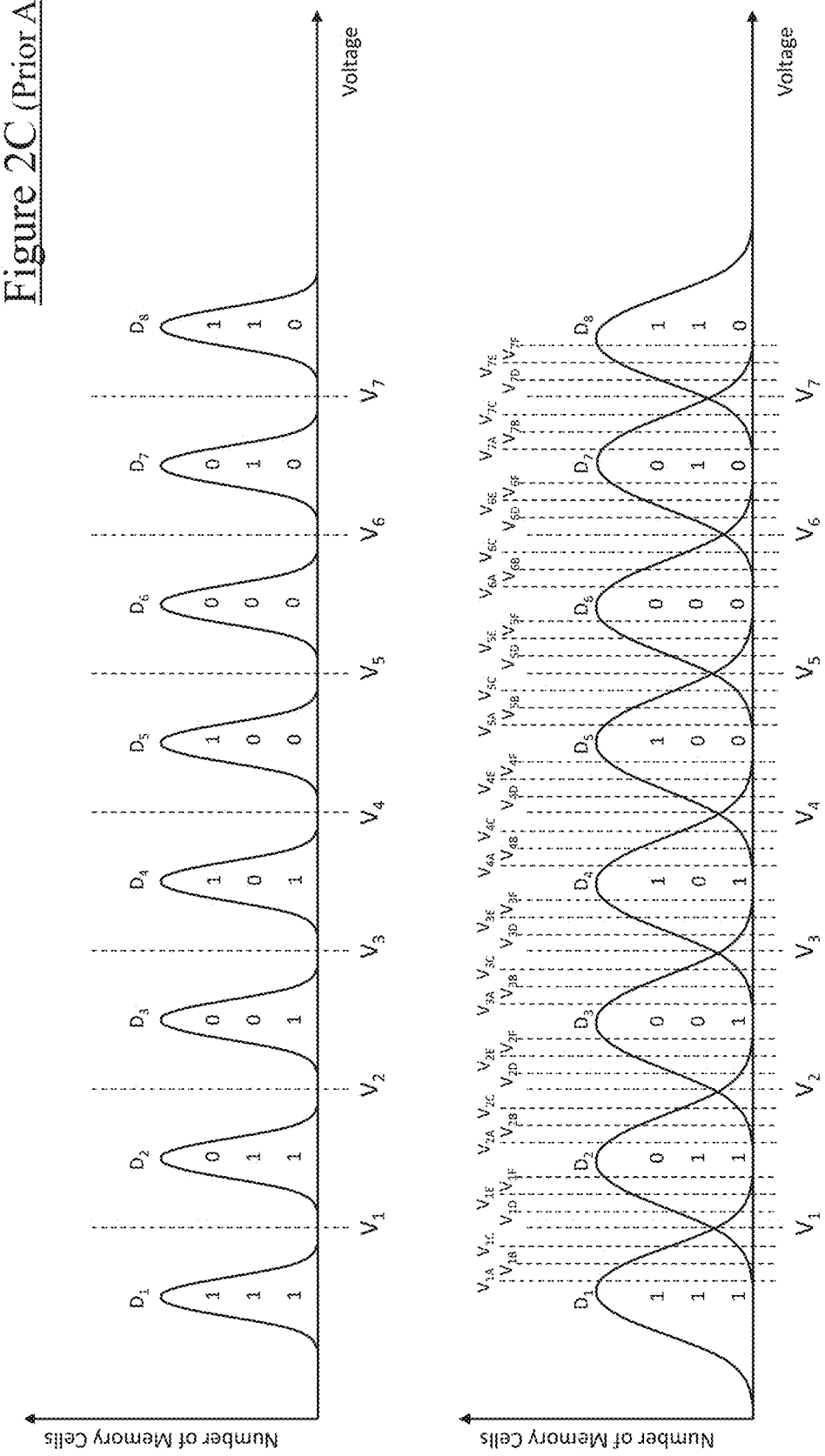

SOLID STATE DEVICE IMPLEMENTING DYNAMIC POLAR ENCODING

BACKGROUND OF THE INVENTION

Field of the Invention

The present invention generally relates to solid state storage devices (hereinafter, "Solid State Drives" or SSD devices), such as SSD devices based on non-volatile memory cells (e.g., NAND flash memory cells) for storing data. More particularly, the present invention relates to SSD devices provided with error correction capabilities. Even more particularly, the present invention relates to SSD devices (or controllers thereof) making use of polar codes.

Overview of the Related Art

Nowadays, the ever-developing digital technologies allow achieving extremely high communication speeds. However, traditional hard disk drives (HDD) can no longer meet the throughput and latency requirements of most state-of-the-art application scenarios. To this end, SSD devices, which feature low access time, high compactness, and low noise, have become increasingly popular for storage market.

SSD devices are mainly based on NAND flash memory cells. As the required storage density increases, most SSD devices consider to store more than two bits in a single memory cell; the more bits are stored in a single memory cell, the worse raw error performance. Therefore, powerful forward-error correction (FEC) methods are required, and voluminous researches on conventional error correction code (ECC) schemes for SSD devices emerge.

Recently, low-density parity-check (LDPC) codes have been considered. To balance performance and complexity, hybrid scheme combining hard decoding and soft decoding is typically employed. However, typical soft decoding, such as soft decoding based on min-sum and belief-propagation, still suffer from high complexity, requiring also read over-sampling.

More recently, polar codes have been proven capacity-achieving performance and reasonable complexity (see E. Ankan, "*Channel polarization: A method for constructing capacity-achieving codes for symmetric binary-input memoryless channels*", IEEE Trans. Inf. Theory, 2009, vol. 55, no. 7, pp. 3051-3073; C. Zhang. B. Yuan, K. K. Parhi, "Reduced-latency sc polar decoder architectures", Proceedings of IEEE International Conference on Communications (ICC), 2012, pp. 3471-3475; and C. Zhang, K. K. Parhi, "*Low-latency sequential and overlapped architectures for successive cancellation polar decoder*", IEEE Trans. Signal Process., 2013, vol. 61, no. 10, pp. 2429-2441).

Besides its good performance over binary-input discrete memoryless channels (B-DMCs), polar code encoding and decoding complexity is much lower than that of LDPC code.

Polar encoding can be described as follows. a number N input bits u; $=(u_1, u_2, \ldots, u_N)$ including K information bits (which are variable bits) and a set $F=N-K$ of frozen bits (which are also referred to as fixed bits) are transformed into N codeword bits $x_i = (x_1, x_2, \ldots, x_N)$ through the linear transformation:

$$x_i = u_i G_N, \text{ with } G_N = B_N G_2^{\oplus n}$$

where:

$$G_2 \triangleq \begin{bmatrix} 1 & 0 \\ 1 & 1 \end{bmatrix};$$

$G_N$ is called generator matrix of size N×N:
$B_N$ is a N×N bit-reversal permutation matrix, and
"⊕n" denotes the n-th Kronecker power.

Therefore, the polar encoded bits include the information and frozen bits encoded with a polar code.

The set F of frozen bits significantly affects the error-correcting performance. Indeed, the set of F frozen bits are used as a reference by the decoding algorithm to determine whether an error has occurred due to noise in the channel (for example during storing and/or reading of the polar encoded bits into and/or from, respectively, the memory cells of the SSD device).

The selection of an optimal set F of frozen bits (which is typically referred to as polar code construction) allows selecting K best among N possible polar bit-channels at a design channel signal-to-noise-ratio (design-SNR) in terms of raw bit error rate (RBER)—or, equivalently, in terms of block error rate (BLER) or frame error rate (FER); otherwise stated, polar code construction is aimed at determining locations of the F frozen bits such that the resulting RBER may be minimized under a proper decoding algorithm.

Optimal polar code construction is hard, and many suboptimal polar code constructions have been proposed with different computational complexities: for example, the original polar code construction algorithm, proposed in E. Ankan. "*A Performance Comparison of Polar Codes and Reed-Muller Codes*", IEEE Communications Letters 12.6, June 2008, and improved later (H. Li and J. Yuan. "*A practical construction method for Polar Codes in A WGN channels*", TENCON Spring Conference. Sydney, NSW, April 2013), is based on the Bhattacharyya bound approximation.

There are a few recent attempts to design universal polar codes (see, for example, E. Sasoglu and L. Wang, "*Universal polarization*." IEEE International Symposium on Information Theory (ISIT), Honolulu, Hi., June 2014: S. H. Hassani and R. Urbanke, "*Universal polar codes*". IEEE International Symposium on Information Theory (ISIT), Honolulu, Hi., June 2014; and M. Alsan, "*Universal polar decoding with channel knowledge at the encoder*". IEEE Information Theory Workshop (ITW), Hobart, Australia, 2014), but they come at a cost of much higher complexity at decoder and/or encoder units.

SUMMARY OF THE INVENTION

The Applicant has recognized that SSD devices based on polar codes are not satisfactory for modern technological requirements.

According to the Applicant, this is substantially due to the fact that, unlike most codes in coding theory, which are considered universal (i.e., their definition may be independent of channel SNR), polar codes are non-universal (i.e. they are strongly affected by channel SNR (indeed, RBER, BLER and FER are functions of channel SNR). Therefore, the Applicant has ascertained that the non-universality of polar codes reflects in codes that change significantly with the design-SNR (and, hence, with the corresponding RBER).

The Applicant has faced the issue of the non-universality of the polar codes, and has devised a solution generally based on a dynamic implementation of polar encoding and decoding. Particularly, the Applicant has devised a solution that allows changing the set F of frozen bits (to be used by the polar code) as a result of a change in the RBER by which the SSD device is affected during lifetime and/or operation.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for operating a solid state storage device. The solid state storage device comprises a plurality of memory cells each one programmable to store a bit pattern among a plurality of bit patterns, each bit pattern being associated with a corresponding nominal threshold voltage of the memory cells. Memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern. The method comprises:

providing a plurality of sets of frozen bits, each set of frozen bits of the plurality of sets of frozen bits being associated with a respective Raw Bit Error Rate (RBER) estimate of a plurality of RBER estimates, and each RBER estimate of the plurality of RBER estimates being estimated according to a respective shape of the threshold voltage distributions, upon request of storing information bits into selected memory cells of the plurality of memory cells:

determining a current value of at least one operative parameter of the solid state storage device affecting the shape of the threshold voltage distributions:

based on the current value of the at least one operative parameter, determining a current shape of the threshold voltage distributions;

determining, among the plurality of RBER estimates, a current RBER estimate associated with the current shape of the threshold voltage distributions:

selecting, among the plurality of sets of frozen bits, a current set of frozen bits associated with the current RBER estimate, encoding the information bits and the current set of frozen bits with the polar code, thereby obtaining polar encoded bits; and storing said polar encoded bits in the selected memory cells; and The method comprises, upon request of retrieving the information bits from the selected memory cells:

reading the polar encoded bits stored in the selected memory cells, and decoding the read polar encoded bits according to said current set of frozen bits.

According to an embodiment of the present invention, said at least one operative parameter of the solid state storage device affecting the threshold voltage distributions comprises at least one among a temperature indication indicative of a temperature of the solid state storage device, a time indication indicative of a time elapsed since a last writing of the plurality of memory cells, and an indication of a number of program/erase cycles performed on the plurality of memory cells.

According to an embodiment of the present invention, said providing a plurality of sets of frozen bits is performed during a characterization of the solid state storage device taking place during and/or after a manufacturing thereof.

According to an embodiment of the present invention, said providing a plurality of sets of frozen bits is based on the Bhattacharyya bound approximation.

According to an embodiment of the present invention, said selecting, among the plurality of sets of frozen bits, a current set of frozen bits associated with the current RBER estimate comprises selecting, among the plurality of sets of frozen bits, the set of frozen bits whose associated RBER estimate is closest in value to the current RBER estimate.

According to an embodiment of the present invention, said storing said polar encoded bits in the selected memory cells further comprises storing an association between the selected memory cells and the current set of frozen bits; advantageously said reading the polar encoded bits stored in the selected memory cells further comprises retrieving the stored association between the selected memory cells and the current set of frozen bits.

According to an embodiment of the present invention, said association between the selected memory cells and the current set of frozen bits comprises an index indicative of the current set of frozen bits among the plurality of sets of frozen bits; advantageously, said storing an association between the selected memory cells and the current set of frozen bits comprises storing in the selected memory cells said index together with at least a subset of the information bits to be stored in said selected memory cells.

According to an embodiment of the present invention, said association between the selected memory cells and the current set of frozen bits comprises an index indicative of the current set of frozen bits among the plurality of sets of frozen bits; said storing an association between the selected memory cells and the current set of frozen bits advantageously comprises storing in the solid state storage device said index together with an address of the selected memory cells.

According to an embodiment of the present invention, the method further comprises performing periodical memory refresh of the solid state storage device. Each memory refresh advantageously comprises, for the selected memory cells:

performing a refresh reading of the polar encoded bits stored in the selected memory cells;

decoding the read polar encoded bits being read during said refresh reading thereby obtaining the respective information bits;

determining the current value of the at least one operative parameter of the solid state storage device affecting the threshold voltage distributions;

based on the current value of the at least one operative parameter, determining the current shape of the threshold voltage distributions;

determining, among the plurality of RBER estimates, the current RBER estimate associated with the current shape of the threshold voltage distributions;

selecting, among the plurality of sets of frozen bits, the current set of frozen bits associated with the current RBER estimate;

encoding the information bits and the current set of frozen bits with the polar code, thereby obtaining refreshed polar encoded bits, and storing said refreshed polar encoded bits in the selected memory cells.

Said reading the polar encoded bits stored in the selected memory cells and said decoding the read polar encoded bits according to said current set of frozen bits upon request of retrieving the information bits from the selected memory cells, advantageously comprise:

reading the refreshed polar encoded bits stored in the selected memory cells, and decoding the read refreshed polar encoded bits according to:

the current set of frozen bits if, between a last memory refresh and said reading of the refreshed polar encoded bits, no updating of the current set of frozen bits has occurred; or a previous set of frozen bits if, between the last memory refresh and said reading of the refreshed polar encoded bits, an updating of the current set of frozen bits has occurred, the previous set of frozen bits preceding the updated current set of frozen bits.

Another aspect of the present invention relates to a controller for a solid state storage device. The solid state storage device comprises a plurality of memory cells each one programmable to store a bit pattern among a plurality of bit patterns, each bit pattern being associated with a corresponding nominal threshold voltage of the memory cells; memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern. The controller is advantageously configured to:

store a plurality of sets of frozen bits, each set of frozen bits of the plurality of sets of frozen bits being associated with a respective Raw Bit Error Rate (RBER) estimate of a plurality of RBER estimates, and each RBER estimate of the plurality of RBER estimates being estimated according to a respective shape of the threshold voltage distributions, and, upon request of storing information bits into selected memory cells of the plurality of memory cells:

determine a current value of at least one operative parameter of the solid state storage device affecting the shape of the threshold voltage distributions;

based on the current value of the at least one operative parameter, determine a current shape of the threshold voltage distributions:

determine, among the plurality of RBER estimates, a current RBER estimate associated with the current shape of the threshold voltage distributions:

select, among the plurality of sets of frozen bits, a current set of frozen bits associated with the current RBER estimate, encode the information bits and the current set of frozen bits with the polar code, thereby obtaining polar encoded bits; and store said polar encoded bits in the selected memory cells.

Upon request of retrieving the information bits from the selected memory cells, the controller is advantageously configured to:

read the polar encoded bits stored in the selected memory cells, and decode the read polar encoded bits according to said current set of frozen bits.

According to an embodiment of the present invention, said at least one operative parameter of the solid state storage device affecting the threshold voltage distributions comprises at least one among a temperature indication indicative of a temperature of the solid state storage device, a time indication indicative of a time elapsed since a last writing of the plurality of memory cells, and an indication of a number of program/erase cycles performed on the plurality of memory cells.

According to an embodiment of the present invention, said plurality of sets of frozen bits is stored in the controller during a characterization of the solid state storage device taking place during and/or after a manufacturing thereof.

According to an embodiment of the present invention, said plurality of sets of frozen bits is determined based on the Bhattacharyya bound approximation.

According to an embodiment of the present invention, the controller is configured to select, among the plurality of sets of frozen bits, a current set of frozen bits associated with the current RBER estimate by selecting, among the plurality of sets of frozen bits, the set of frozen bits whose associated RBER estimate is closest in value to the current RBER estimate.

According to an embodiment of the present invention, the controller is configured to store said polar encoded bits in the selected memory cells by further storing an association between the selected memory cells and the current set of frozen bits; the controller is advantageously configured to read the polar encoded bits stored in the selected memory cells upon retrieving the stored association between the selected memory cells and the current set of frozen bits.

According to an embodiment of the present invention, said association between the selected memory cells and the current set of frozen bits comprises an index indicative of the current set of frozen bits among the plurality of sets of frozen bits, the controller being advantageously configured to store in the selected memory cells said index together with at least a subset of the information bits to be stored in said selected memory cells.

According to an embodiment of the present invention, said association between the selected memory cells and the current set of frozen bits comprises an index indicative of the current set of frozen bits among the plurality of sets of frozen bits, the controller being advantageously configured to store in the solid state storage device said index together with an address of the selected memory cells.

According to an embodiment of the present invention, the controller is further configured to perform periodical memory refresh of the solid state storage device. Each memory refresh advantageously comprises, for the selected memory cells:

performing a refresh reading of the polar encoded bits stored in the selected memory cells;

decoding the read polar encoded bits being read during said refresh reading thereby obtaining the respective information bits;

determining the current value of the at least one operative parameter of the solid state storage device affecting the threshold voltage distributions;

based on the current value of the at least one operative parameter, determining the current shape of the threshold voltage distributions:

determining, among the plurality of RBER estimates, the current RBER estimate associated with the current shape of the threshold voltage distributions;

selecting, among the plurality of sets of frozen bits, the current set of frozen bits associated with the current RBER estimate:

encoding the information bits and the current set of frozen bits with the polar code, thereby obtaining refreshed polar encoded bits, and storing said refreshed polar encoded bits in the selected memory cells.

The controller is advantageously configured to, upon request of retrieving the information bits from the selected memory cells:

read the refreshed polar encoded bits stored in the selected memory cells, and decode the read refreshed polar encoded bits according to:

the current set of frozen bits if, between a last memory refresh and said reading of the refreshed polar encoded bits, no updating of the current set of frozen bits has occurred; or a previous set of frozen bits if, between the last memory refresh and said reading of the refreshed polar encoded bits, an updating of the current set of frozen bits has occurred, the previous set of frozen bits preceding the updated current set of frozen bits.

A further aspect of the present invention relates to a solid state storage device comprising said plurality of memory cells and said controller.

BRIEF DESCRIPTION OF THE ANNEXED DRAWINGS

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to an embodiment of the present invention;

DETAILED DESCRIPTION OF PREFERRED EMBODIMENTS OF THE INVENTION

Figure 1A:
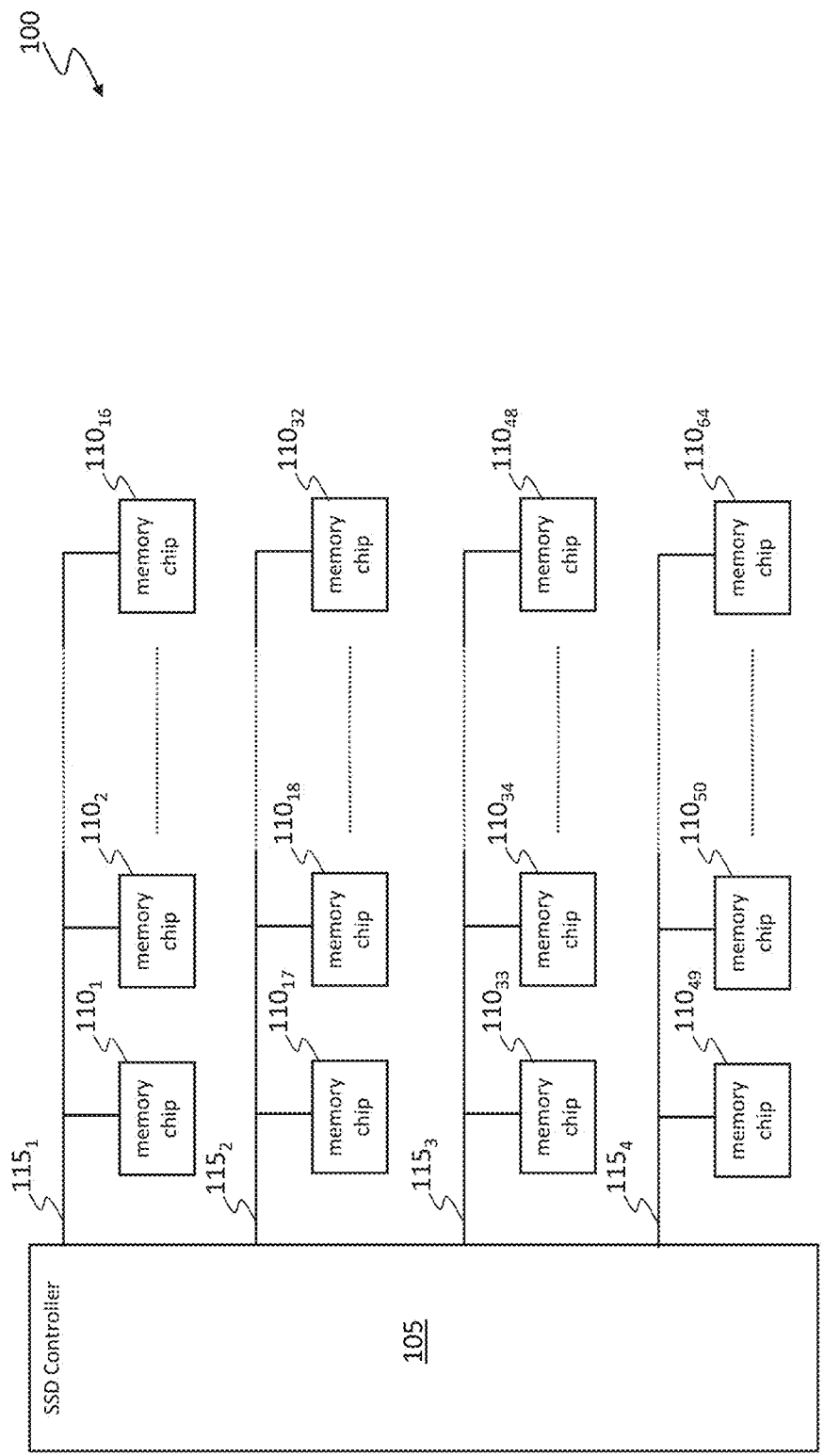

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_m$ for storing bits even in the absence of external power supply (m=1, 2, 3, . . . , M, with M=64 in the example at issue), and a plurality of (e.g., synchronous and/or asynchronous) channels $115_h$ (h=1, 2, 3, . . . , H, with H=4 in the example at issue) communicably coupling the SSD controller 105 and the memory chips $110_m$ to each other—in the exemplary illustration, each channel $115_h$ communicably couples the SSD controller 105 to a set of 16 memory chips $110_m$ (e.g., with the channels $115_1$, $115_2$, $115_3$ and $115_4$ that communicably couple the SSD controller 105 to the memory chips $110_1$-$110_6$, $110_{17}$-$110_{32}$, $110_{33}$-$110_{48}$ and $110_{49}$-$110_{64}$, respectively).

Figure 1B:
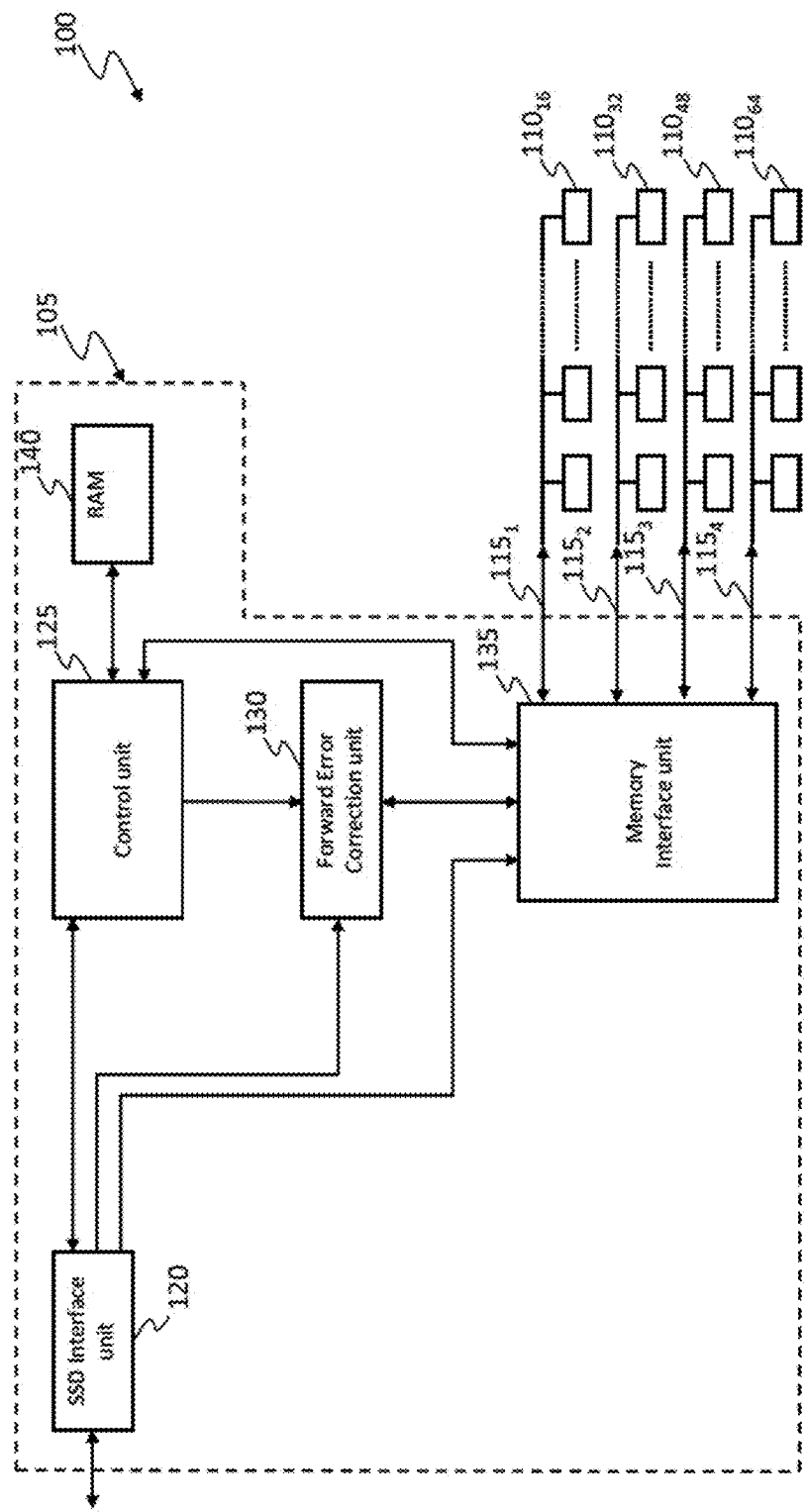

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_m$ and the channels $115_h$ (only some of them being numbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but is not limited to, information bits to be stored (i.e., the information bits to be written in the memory chips $110_m$), read information bits (i.e., the information bits stored in, and read from, the memory chips $110_m$), user commands indicative of the operations to be performed by the SSD controller 105 on the memory chips $110_m$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_m$ along the channels $115_h$ and bit transport to and from the SSD interface unit 120, and coordinating enabling and/or disabling of the memory chips $110_m$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_m$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_m$ along the respective channels $115_h$, the SSD controller 105 comprises one (as herein exemplary illustrated) or more memory interface units 135—alternatively, a memory interface unit 135 for each channel $115_h$ may be provided, or a memory interface unit 135 for each memory chip $110_m$ or for each group of memory chips $110_m$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_m$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_m$ may comprise one or more flash memory dice.

Figure 2A:
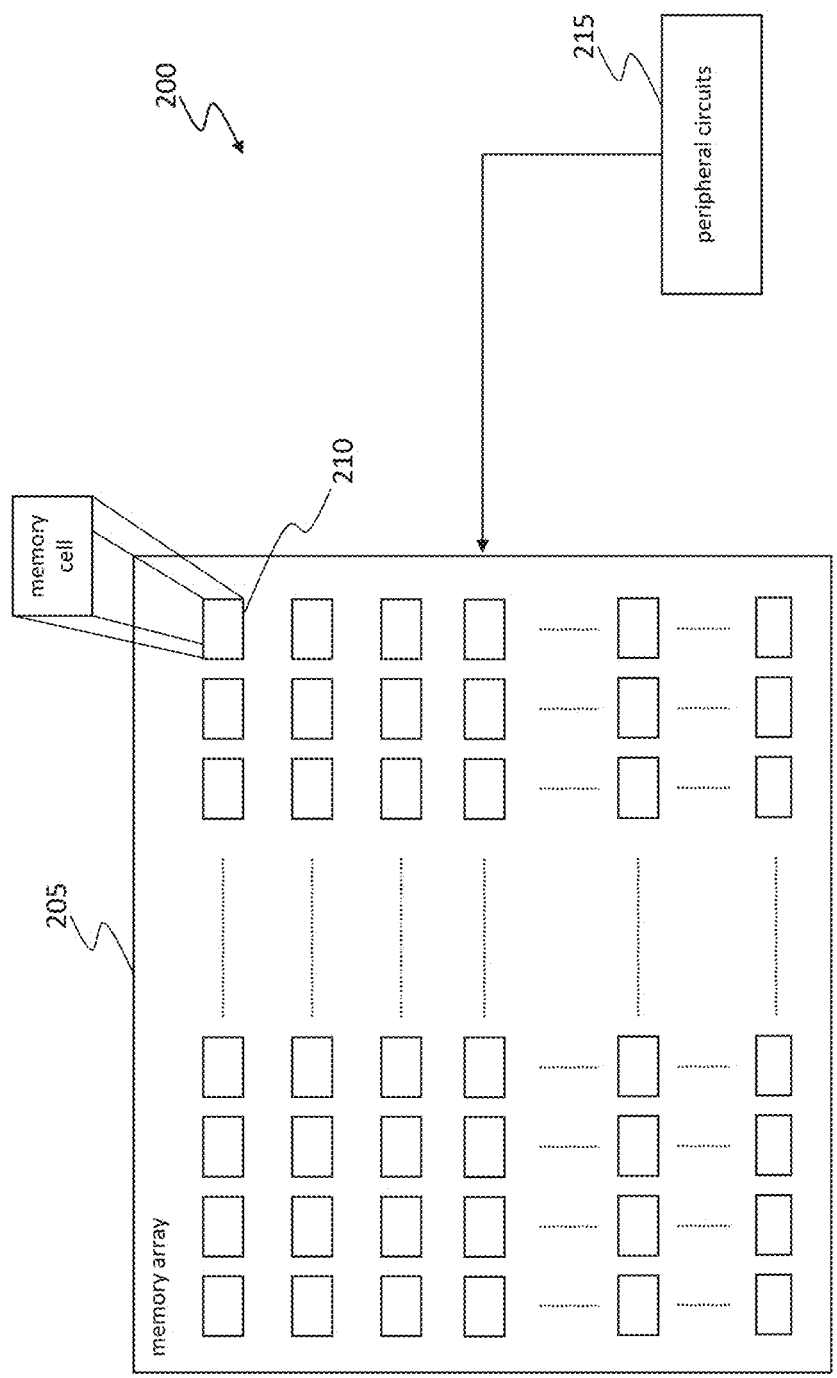

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 preferably comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining, i.e. being associated with, two threshold voltages), in "Multi-Level Cell" (MLC) technology each memory cell (or MLC memory cell) is capable of storing one symbol (or bit pattern) comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol (or bit pattern) comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take (j=1, 2, . . . , 4 for a MLC memory cell, and j=1, 2, . . . , 8 for a TLC memory cell). This is schematically shown in the top drawing of FIG. 2B for a MLC memory cell and in the top drawing of FIG. 2C for a TCL memory cell.

Figure 2B:
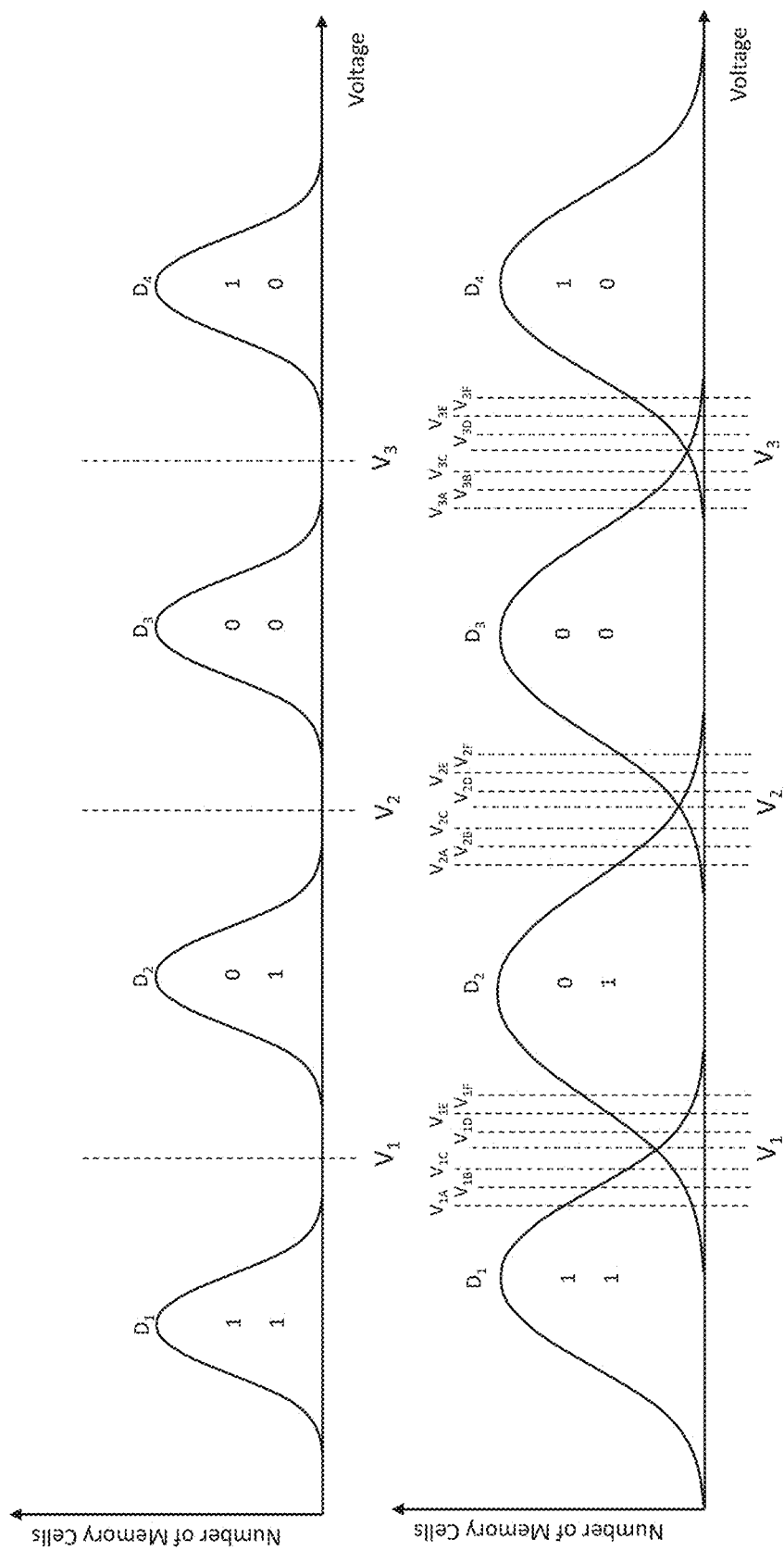

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C; k would instead be equal to 1 in case of a SLC memory cell).

In the case of SLC memory cell, not shown, during a read operation a threshold voltage below the hard reference voltage $V_1$ represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10" (see top drawing of FIG. 2B).

In the case of TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages V and $V_4$ represents the symbol "101", a threshold voltage between the hard reference voltages $V_1$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110" (see top drawing of FIG. 2C).

To read a memory cell 210, the threshold voltage of the memory cell 210 is compared to the hard reference voltages $V_k$. For example, reading a memory cell 210 that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

Figure 3A:
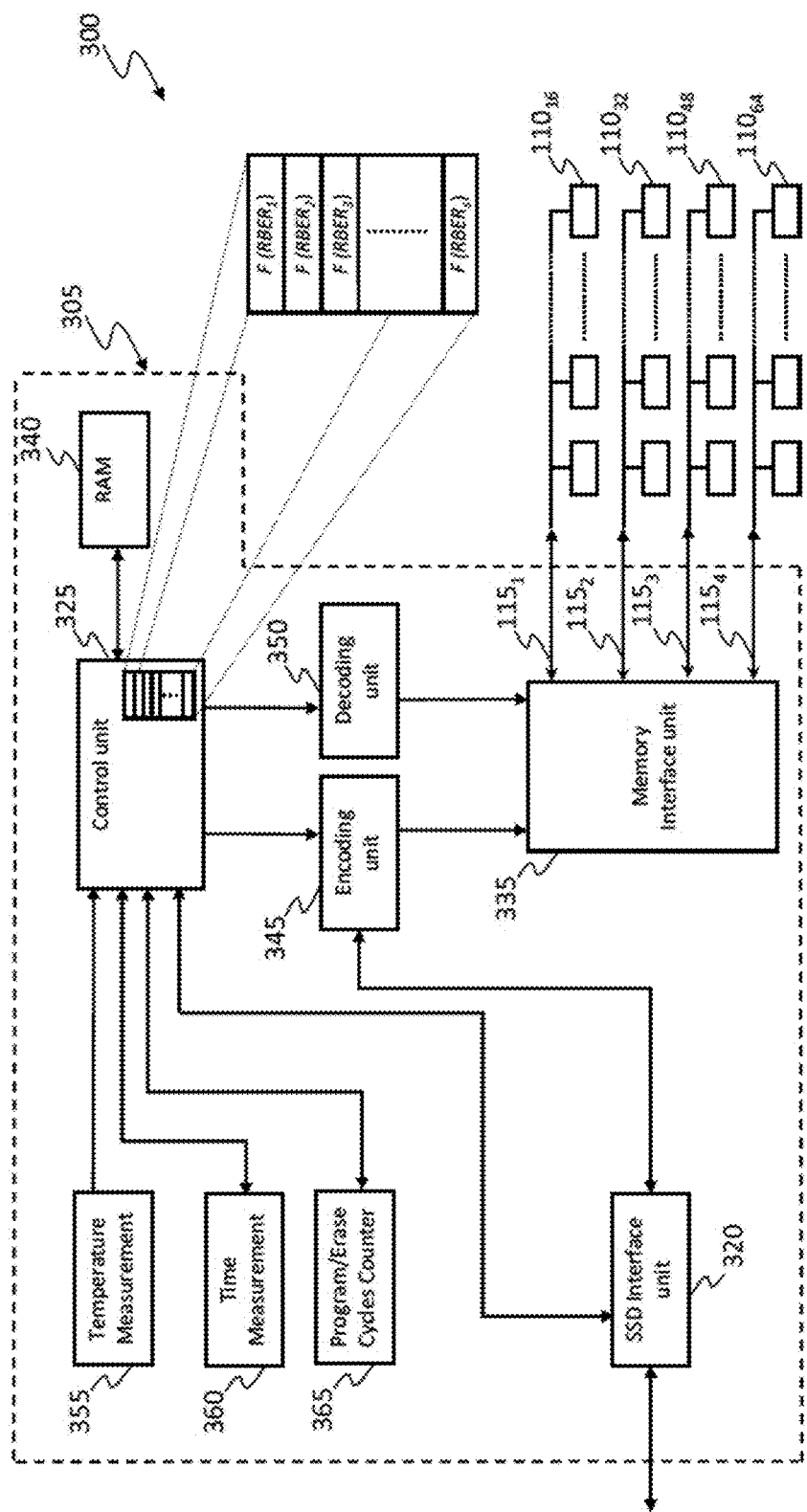
FIG. 3B shows an exemplary encoding scheme of polar encoding.
FIG. 3C shows an exemplary successive cancellation decoding scheme that may be applied to polar encoded bits.

With reference now to FIG. 3A, it schematically shows, in terms of operating units, a simplified architecture of a SSD controller 305 according an embodiment the present invention. For the sake of completeness, such a figure also shows, in a smaller size, the memory chips $110_m$ and the channels $115_h$ (only some of them being numbered in such a figure for ease of illustration), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention.

As visible in the figure, the SSD controller 305 comprises a SSD interface 320, a control unit 325, a memory interface unit 335, and a memory unit 340, which are respectively similar to the SSD interface 120, the control unit 125, the memory interface unit 135, and the memory unit 140 of the SSD controller 105, and therefore they will not be discussed again for the sake of conciseness.

The SSD controller 305 also comprises an encoding unit 345 for encoding the bits to be stored in the memory array 205 (i.e., the information bits) by means of an ECC code, and a decoding unit 350 for decoding the read bits and determining the information bits. According to an embodiment of the present invention, the encoding 345 and decoding 350 units are implemented in the FEC unit (not shown in this figure).

Preferably, the ECC code is an ECC code allowing soft decoding—or, otherwise stated, an ECC code that allows determining each bit value (or bit pattern value or symbol value, when considering MLC and TLC memory cells) by means of hard bits (i.e., the read bits resulting from comparisons to the hard reference voltages $V_k$) and of additional information including soft bits and an indication of the reliability of each read (hard and soft) bit. The soft bits preferably arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$–$V_{kF}$ associated with each hard reference voltage $V_k$—the read operations at the soft reference voltages $V_{kA}$–$V_{kF}$ provide the soft bits, and are typically denoted as soft read operations (as opposed to the read operations at the hard reference voltages $V_k$ providing the hard bits, which are typically denoted by hard read operations). In other words, the soft bits and the indication of the reliability of the read (hard and soft) bits provide additional information that can be used by the decoding unit to speed up and/or to quickly converge. By way of example only, the soft reference voltages $V_{kA}$–$V_{kC}$ may be obtained by progressively decreasing the hard reference voltage $V_k$ by a 0.5V step, whereas the soft reference voltages $V_{kD}$–$V_{kF}$ may be obtained by progressively increasing the hard reference voltage $V_k$ by a 0.5V step.

Preferably, the indication of the reliability of the read (hard and soft) bits is in the form of "Log Likelihood Ratio" values (LLR, hereinafter, LLR values) associated with those bits (in other words, each LLR value is a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 15 is more likely to be a 0 than a bit with an LLR value equal to 5, and a bit with an LLR value equal to −15 is more likely to be a 1 than a bit with an LLR value equal to −5. An LLR value equal to 0 may instead indicate that the bit is equally likely to be a 0 or a 1 (and therefore correspond to a complete uncertainty about the bit value, i.e. the estimation is completely unreliable).

According to an embodiment of the present invention, the ECC code is a polar code—hence, the corresponding encoded bits will be referred to as polar encoded bits. Although not shown, the polar encoded bits are properly mapped into mapped polar encoded bits (the mapped polar encoded bits representing the symbols to be written/programmed), thereafter the symbols can be stored in the memory chips $110_m$ (by means of the memory interface unit 335 that transmits the symbols to the memory chips $110_m$ and thanks to control unit 325 action that controls addressing of the memory chips $110_m$ to be written/programmed). After a read operation, the read symbols are properly demapped (demapping and mapping operations being substantially reverse operations with respect to each other), therefore the (demapped) read symbols are decoded by the decoding unit 350 in order to extract the respective information bits.

Polar codes were introduced in 2009 (see E. Arikan, "*Channel Polarization: A method for Constructing Capacity Achieving Codes for Symmetric Binary-Input Memoryless Channels*," IEEE Trans. Inform. Theory, vol. 55, pp. 3051-3073 (2009), and E. Arikan and E. Telatar. "*On the Rate of Channel Polarization*" in Proc. IEEE Int'l Symp. Inform. Theory, Seoul, South Korea. pp. 1493-1495 (2009)).

A polar code is a linear ECC code which is provably capacity-achieving.

Polar encoding can be described as follows. N input bits $u_i=(u_1, u_2, \ldots, u_N)$ including K information bits (which are variable bits) and a set F=N−K of frozen bits (which are also referred to as fixed bits) are transformed into N codeword bits $x_i=(x_1, x_2, \ldots, x_N)$ through the linear transformation:

$$x_i = u_i G_N, \text{ with } G_N = B_N G_2^{\oplus n}$$

where:

$$G_2 \triangleq \begin{bmatrix} 1 & 0 \\ 1 & 1 \end{bmatrix};$$

$G_N$ is called generator matrix of size N×N;
$B_N$ is a N×N bit-reversal permutation matrix, and
"⊕n" denotes the n-th Kronecker power.

Therefore, the polar encoded bits include the information and frozen bits encoded with a polar code.

The set of F frozen bits are used as a reference by the decoding algorithm implemented in the decoding unit 350 to determine whether an error has occurred due to noise in the channel 115$_h$ (for example during storing and/or reading of the polar encoded bits into and/or from, respectively, the memory cells of the SSD device). For example, the known value (typically "0") of a frozen bit may be compared to the value determined through the decoding algorithm, to determine whether an error has occurred. When the polar encoded bits stored in the memory cells of the SSD device are read, and demapped, the read polar encoded bits include the frozen bits (which are fixed, and hence known and unchanged) and unfrozen bits indicative of said information bits (the unfrozen bits therefore corresponding to the information bits resulting from the read operation and whose decoding and error correction allow retrieving the original information bits).

Figure 3B:
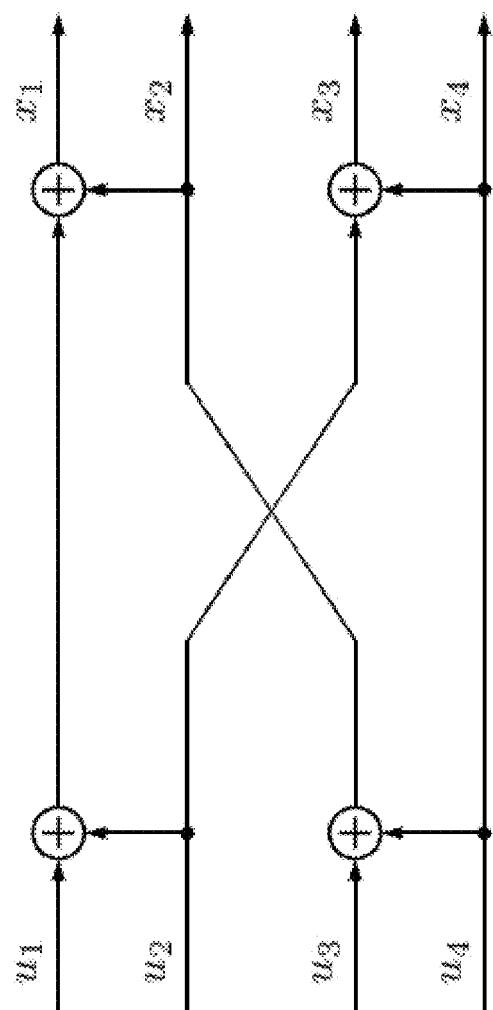

FIG. 3B shows an exemplary encoding scheme of polar encoding for N=4 bits. In this case, the generator matrix $G_4$ is:

$$G_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix}$$

and $x_i = [x_1 = (u_1 \oplus u_2 \oplus u_3 \oplus u_4); x_2 = (u_3 \oplus u_4); x_3 = (u_2 \oplus u_4); x_4 = u_4]$.

As mentioned in E. Arikan, "*Channel Polarization: A Method for Constructing Capacity-Achieving Codes for Symmetric Binary-Input Memoryless Channels*", IEEE Trans. Inf. Theory, vol. 55, no. 7, pp. 3051-3073, July 2009, polar codes can be decoded by a successive cancellation decoding algorithm. According to the successive cancellation decoding algorithm, an estimate $\hat{u}_i$ of the input bits $u_i$ is obtained based on the channel output $y_1^N$ (i.e., the read or output polar encoded bits/symbols) and all past estimates $\hat{u}_1^{i-1}$. If the input bit $u_i$ is a frozen bit, the estimate $\hat{u}_i$ is set to its known value, otherwise $$\hat{u}_i = h_i(y_1^N, \hat{u}_1^{i-1})$$

where $$h_i(y_1^N, \hat{u}_1^{i-1}) = \begin{cases} 0 & \text{if } \ln\left(\frac{W_N^{(i)}(y_1^N, \hat{u}_1^{i-1} | u_i = 0)}{W_N^{(i)}(y_1^N, \hat{u}_1^{i-1} | u_i = 1)}\right) > 0 \\ 1 & \text{otherwise} \end{cases}$$

In the above expression, $W_N^{(i)} = (W_N^{(1)}, W_N^{(2)}, \ldots, W_N^{(N)})$ represent the N transformed binary input channels that can be synthesized for the input bits $u_i = (u_1, u_2, \ldots, u_N)$, respectively, and $$\ln\left(\frac{W_N^{(i)}(y_1^N, \hat{u}_1^{i-1} | u_i = 0)}{W_N^{(i)}(y_1^N, \hat{u}_1^{i-1} | u_i = 1)}\right) = L_n^{(i)}[l]$$

represents the channel LLR.

Figure 3C:
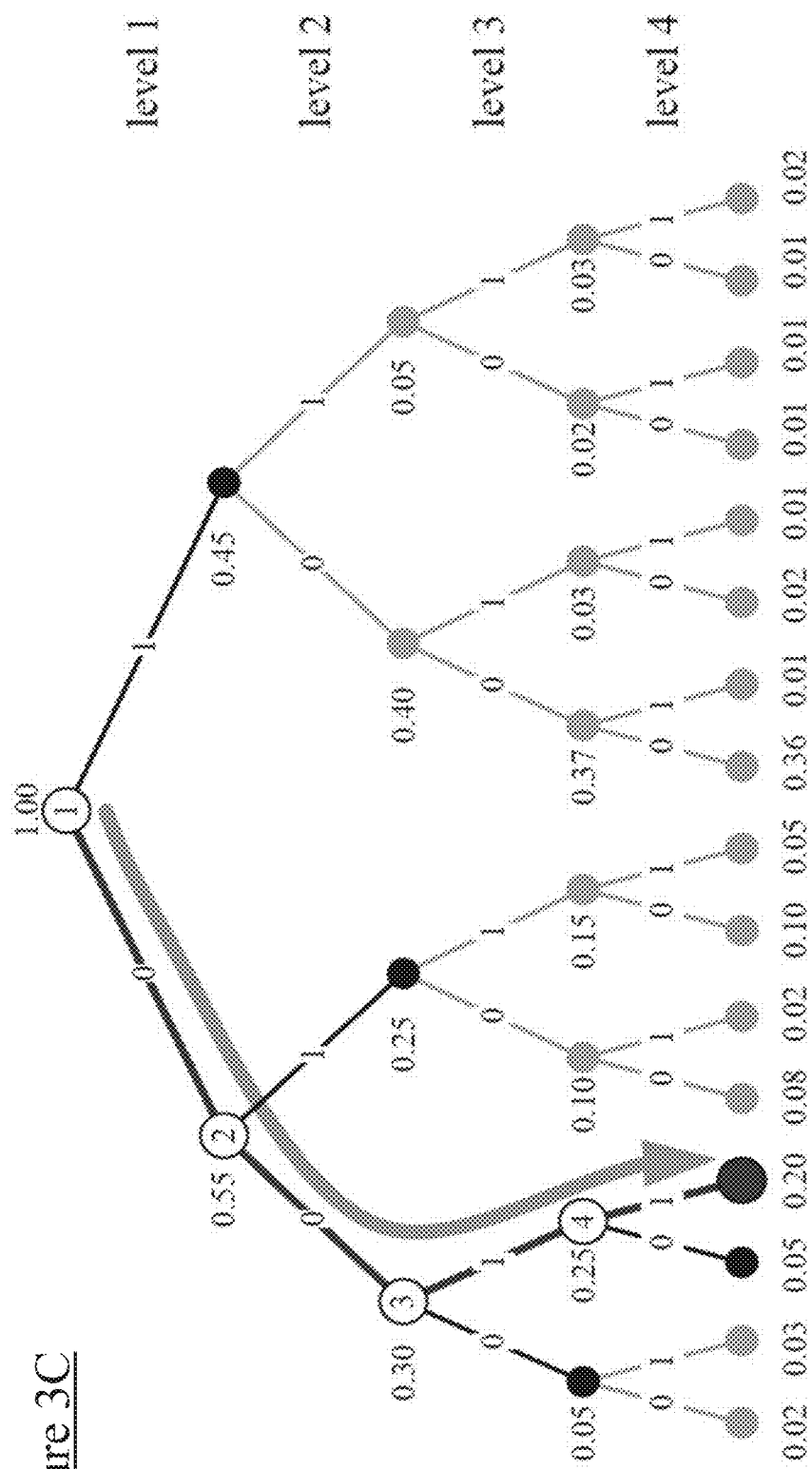

FIG. 3C shows an exemplary successive cancellation decoding scheme. As visible in the figure, the successive cancellation decoding may be represented as a decoding path searching process on a code tree. For a polar code with code length N, the corresponding code tree is a full binary tree with N decoding levels or iterations (N=4 in the illustrated example). At each decoding level, only the one of two edges with larger probability is selected for further processing. The bold edges in FIG. 3C show the successive cancellation decoding path. The number in correspondence of each node provides a metric of the decoding path from the root to that node—the metric being indicative of a reliability of the decoding path, and being for example expressed as a posteriori probability (as typical in successive cancellation decoding).

The nodes which are extended during the successive cancellation decoding procedure are represented by the numbered circles, and the corresponding numbers indicate the processing order. The black circles represent the nodes which are visited (whose a posteriori probability metric is calculated) but failed in competition for further exploring, whereas the grey circles represent the nodes which are not visited during the searching process. In the shown example, four times of calculation of the a posteriori probability are required, one for each decoding level.

The choice or selection of the set F of frozen bits (usually referred to as polar code construction) is an important step in polar coding, in that it affects the error-correcting performance significantly (as discussed here below).

A polar code construction is any algorithm that selects K best among N possible polar bit-channels at a design channel signal-to-noise-ratio (design-SNR) in terms of raw bit error rate (RBER)—or, equivalently, in terms of block error rate (BLER) or frame error rate (FER. i.e. the RBER observed after application of the ECC); otherwise stated, polar code construction is aimed at determining locations of the F frozen bits; for example, a polar code construction may determine locations of the F frozen bits so that the resulting RBER may be minimized under a proper decoding algorithm (for example, the above-mentioned successive cancellation decoding algorithm).

Optimal polar code construction is hard, and many suboptimal polar code constructions have been proposed with different computational complexities: for example, the original polar code construction algorithm, proposed in E. Ankan. "*A Performance Comparison of Polar Codes and Reed-Muller Codes*", IEEE Communications Letters 12.6, June 2008, and improved later (H. Li and J. Yuan. "*A practical construction method for Polar Codes in A WGN channels*", TENCON Spring Conference, Sydney, NSW, April 2013), is based on the Bhattacharyya bound approximation. There are a few recent attempts to design universal polar codes (see, for example, E. Sasoglu and L. Wang, "*Universal polarization*," IEEE International Symposium on Information Theory (ISIT), Honolulu, Hi., June 2014; S. H. Hassani and R. Urbanke, "*Universal polar codes*", IEEE International Symposium on Information Theory (ISIT), Honolulu, Hi., June 2014: and M. Alsan, "*Universal polar decoding with channel knowledge at the encoder*", IEEE Information Theory Workshop (ITW), Hobart, Australia, 2014), but they come at a cost of much higher complexity at decoder and/or encoder units.

Unlike most codes in coding theory, which are considered universal (i.e., their definition may be independent of channel SNR, polar codes are non-universal (i.e. they are strongly affected by channel SNR (indeed, RBER, BLER and FER are functions of channel SNR). Therefore, non-universality of polar codes reflects in codes that change significantly with the design-SNR (and, hence, with the corresponding RBER).

The Applicant has faced the issue of the non-universality of the polar codes, and has devised a solution generally based on a dynamic implementation of polar encoding (and decoding). Particularly, the Applicant has devised a solution that allows changing the set F of frozen bits (to be used by the polar code) as a result of a RBER change.

As mentioned above, the design-SNR depends on RBER, whose estimate in turns depends on the shape, and particularly on the overlap areas, of the threshold voltage distributions $D_j$—in the art, a number of techniques for estimating the RBER exist, which are typically developed autonomously by the manufacturers for their specific design needs and convenience. Thus, each RBER (estimate) is associated with a respective design-SNR (and, hence, with a respective set F of frozen bits). According to an embodiment of the present invention, these sets of frozen bits are arranged in a table (hereinafter, F-table), preferably stored in the control unit 325 of the SSD controller 305 (as schematically illustrated in the enlarged detail in FIG. 3A) and accessed by the encoding 345 and decoding 350 units when required (as better discussed in the following).

Preferably, the F-table is structured such that each row of the F-table comprises the set F of frozen bits associated with a respective RBER estimate—conceptually denoted in the figure by the wording F(RBERs), with s=1, 2, 3, . . . , S (the number S of stored rows of sets F of frozen bits being preferably chosen according to specific design options). The S sets F of frozen bits are preferably determined during the experimental characterization of the SSD device 300 that typically takes place during and/or after the manufacturing thereof, according to the exemplary considered embodiment, the S sets F of frozen bits are preferably determined based on the above-mentioned Bhattacharyya bound approximation.

In other words, the F-table comprises a plurality of sets F of frozen bits, with each set F of frozen bits that is associated with a respective RBER estimate (and, hence, with a respective design-SNR used in the characterization phase of the SSD device 300), so that, as better discussed in the following, when a change in the RBER estimate is detected (or, more generally, when a change in the shapes of the threshold voltage distributions $D_j$ is detected) and a current RBER estimate is evaluated (or, more generally, a current shape of the threshold voltage distributions $D_j$ is evaluated), a set F of frozen bits corresponding to (i.e., associated with) the current RBER estimate is selected.

According to an embodiment of the present invention, a change in the RBER estimate (or, more generally, a change in the shapes of the threshold voltage distributions $D_j$) is detected based on one or more operative parameters of the SSD device 300 (including, for example, temperature, time from a last writing of the memory cells, and number of program/erase cycles already performed on the memory cells), hereinafter referred to as operating parameters, that have been experimentally found to affect the threshold voltage distributions $D_j$ (particularly, their shapes), and hence the RBER.

In order to achieve that, as visible in FIG. 3A, the SSD controller 305 according to the present invention preferably comprises one or more measurement units, discussed here below, for measuring (or at least allowing to determine) one or more among the above operating parameters.

Particularly, the SSD controller 305 preferably comprises a temperature measurement unit 355 for providing a temperature indication indicative of a temperature of the SSD device 300 (and, preferably, of the memory cells 210). For the purposes of the present invention the expression "temperature indication" is intended to encompass both direct measurements (e.g., by means of a temperature sensor), and indirect measurements (e.g., by evaluating another property of the SSD device 300 that allows determining the temperature thereof). Depending on the hardware implementation, it may also be necessary to take into account appropriate offset values for the temperature, for example depending on whether a temperature sensor is located in the close vicinity of the memory cells 210 or relatively far from them.

According to an embodiment of the present invention, the temperature measurement unit 355 is a temperature sensor connected to the control unit 325 (e.g., in a bidirectional manner). Without losing generality, the temperature sensor may be any type of temperature sensor, including but not limited to a diode, a NTC ("Negative Temperature Coefficient") resistor, a digital temperature sensor, an infrared sensor, a transistor. Additionally or alternatively, the temperature sensor may be integrated into the flash memory die 200 or, as exemplary illustrated, into the SSD controller 305.

In alternative embodiments of the present invention, not shown, the temperature sensor is a discrete/integrated solution outside the SSD controller 305 or outside the SSD device 300 (being for example part of a slot for receiving the SSD device 300), in which cases the temperature measurement unit 355 may be a temperature interface connecting (i.e., interfacing) the temperature sensor and the control unit 325 to each other.

Additionally (as herein exemplary assumed) or alternatively to the temperature measurement unit 355, the SSD controller 305 preferably comprises a time measurement unit 360 for determining a time indication indicative of a time elapsed since a last writing (program or erase) of the memory cells. Similarly to the above, for the purposes of the present invention, the expression "time indication" is intended to encompass both a direct measurement (e.g., by means of a counter), and an indirect measurement (e.g., by evaluating another property of the SSD device 300 that allows determining the time indication). Depending on the hardware implementation it may also be necessary to take into account appropriate offset values for the time indication.

Additionally (as herein exemplary assumed) or alternatively to the temperature measurement unit 355 and to the time measurement unit 360, the SSD controller 305 preferably comprises a program/erase cycle measurement unit (or P/E cycle counter) 365 for determining an indication of the number of program/erase cycles (or number of P/E cycles) already performed on the memory cells. Similarly to the above, for the purposes of the present invention, the expression "indication of the number of program/erase cycles" is intended to encompass both a direct measurement (e.g., by means of a physical or hardware counter), and an indirect measurement (e.g., by evaluating another property of the SSD device 300 that allows determining the number of P/E cycles).

As better discussed in the following, according to the present invention, the temperature indication and/or the time indication and/or the number of P/E cycles are used for updating the set F of frozen bits in order to polar encode them with the information bits to be stored (and to successively polar decode them upon request of retrieving the stored information bits).

In order to achieve that, the SSD controller 305 preferably stores, e.g. within the memory unit 340, indications on the predetermined temperature dependency according to which the (estimate of the) RBER changes with temperature, and/or indications on the predetermined time dependency according to which the (estimate of the) RBER changes over time, and/or indication on the predetermined P/E cycle dependency according to which the (estimate of the) RBER changes with the number of P/E cycles, so that the (estimate of the) RBER is corrected or updated (and, hence, the set F of frozen bits are updated) according to the temperature indication, and/or time indication and/or number of P/E cycles and the predetermined temperature and/or time and/or P/E cycle dependencies. Preferably, the predetermined temperature and/or time and/or P/E cycle dependencies are obtained during the experimental characterization of the SSD device 300.

Figure 4:
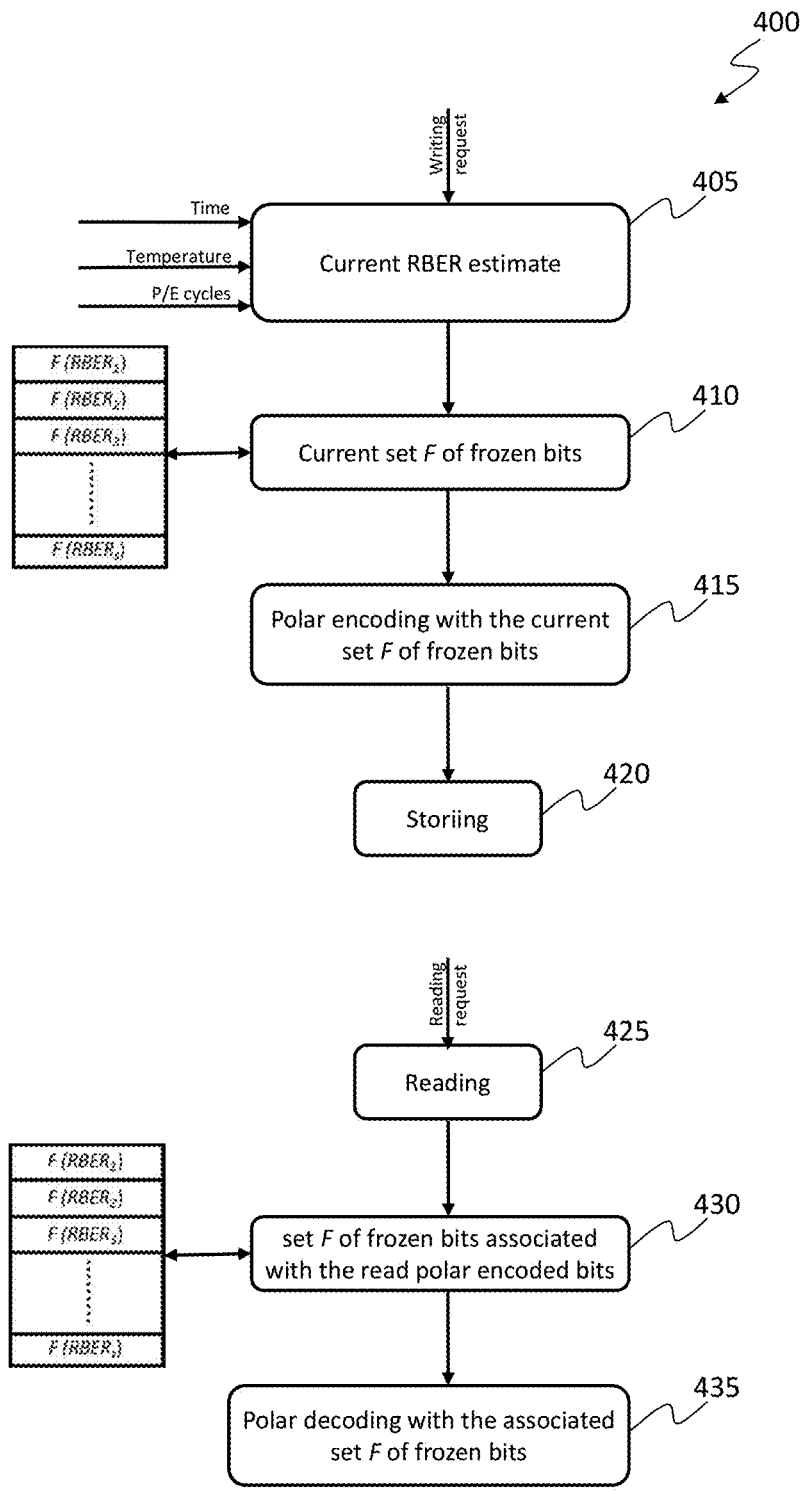
FIG. 4 shows an activity diagram of a procedure carried out by the SSD controller of FIG. 3A, according to an embodiment of the present invention.

With reference now to FIG. 4, it schematically shows, according to an embodiment of the present invention, an activity diagram of a procedure 400 carried out by the SSD controller 305 (e.g., based on its built-in firmware) for operating the SSD device 300.

Upon request of storing information bits into selected memory cells (writing request), the current value(s) of the measured or monitored operative parameter(s) of the solid state storage device 300 affecting the threshold voltage distributions (in the example at issue, temperature, time from the last writing, and number of P/E cycles) is determined or retrieved, and, based on the current value(s) of the measured or monitored operative parameter(s), the current shape of the threshold voltage distributions is determined, and the current RBER estimate associated with the current shape of the threshold voltage distributions is determined (action node 405).

Then, upon determining the current RBER estimate, the controller 305 accesses the F-table and retrieves or selects, among the plurality S of sets F of frozen bits, a current set of frozen bits associated with the current RBER estimate (action node 410). Since the F-table stores a certain, discrete number S of sets F of frozen bits (F(RBERs)), which are determined based on corresponding discrete values of design-SNRs (and, hence, on corresponding discrete values of RBER), the association between the current set of frozen bits and the current RBER estimate may advantageously be determined based on a proper association criterion (indeed, the current RBER estimate may be, and in practical scenarios is, different from the discrete values of RBER stored in the F-table).

According to an exemplary embodiment of the present invention, the association criterion may be based on "proximity", i.e. the set F of frozen bits corresponding to a RBER closest in value to the current RBER estimate is selected as current set F of frozen bits.

However, any other association criterion may be used without prejudice for the present invention.

Then the information bits and the current set F of frozen bits are encoded with the polar code thereby obtaining the polar encoded bits (action node 415), and the polar encoded bits are stored in the selected memory cells (action node 420).

As should be understood, the polar encoded bits may be read after a certain time period from their storing, therefore the set F of frozen bits used to obtain the polar encoded bits being read has to be found or retrieved. In order to take into account such a condition, upon storing of the polar encoded bits in the selected memory cells, the controller 305 is preferably configured to store (step not shown in the activity diagram) also an association between the used (current) set F of frozen bits and the selected memory cells currently addressed for storing the corresponding polar encoded bits (so that, as better discussed here below, upon reading the stored encoded bits, the set F of frozen bits that has been used to perform the respective polar encoding may be retrieved or found).

According to a first embodiment of the present invention, the association between the addressed memory cells and the used set F of frozen bits is achieved by storing a n-bit index (e.g., a three-bit index or a four-bit index) indicative of the used (i.e., currently used) set F of frozen bits among the S sets F of frozen bits (and, preferably, indicative of a position of the used set F of frozen bits in the F-table) together with the address of the memory cells in a proper (e.g., dedicated) location of the memory unit 340. As an alternative, the n-bit index and the address of the memory cells may be stored at firmware level (i.e., in the SSD controller firmware), e.g. by assigning the n-bit index and the address of the memory cells to a properly defined variable in the SSD controller firmware.

According to a second embodiment of the present invention, the association between the addressed memory cells and the used set F of frozen bits is achieved by including the n-bit index in at least a subset of the information bits to be stored, e.g. by adding the n-bit index to the information bits to be stored or by replacing n information bits (among the information bits to be stored) with the n-bit index: in both cases, the n-bit index is advantageously placed at a suitable (e.g., predetermined) position with respect to the information bits (for example, at the beginning thereof), so as to allow easy recognizing of the n-bit index upon reading.

According to a different embodiment of the present invention, no association between the addressed memory cells and the used set F of frozen bits is performed during writing, one among the most recent (i.e., recently used) sets F of frozen bits being instead associated with the encoded bits upon their reading. In this embodiment, the SSD controller 305 may be configured to store, either in the SSD controller firmware or within a proper (e.g., dedicated) location of the memory unit 340, only the current (i.e., the most recently used or the last used) set F of frozen bits, and upon reading stored encoded bits from selected memory cells, the set F of frozen bits used for their decoding is the one in a predefined relationship with the current set F of frozen bits (such as the current or last set F of frozen bits itself, or the set F of frozen bits that, in the F-table, takes one or more previous index positions with respect to the current set F of frozen bits, such as the second last or immediately previous set F of frozen bits).

Preferably, the predefined relationship between the set F of frozen bits that has been used for polar encoding the read encoded bits and the current (i.e., the most recently used or the last used) set F of frozen bits is determined based on a refresh interval of a memory refresh set for the SSD device 300. Memory refresh is the background maintenance process of periodically reading information from the memory cells of the SSD device 300 and immediately rewriting the read information in the same memory cells without modification, for the purpose of preserving the information.

According to the this embodiment, at each memory refresh, the read information, after decoding thereof, is polar encoded with the current set F of frozen bits associated with the current aging status of the SSD device 300 (in fact, as mentioned above, the succession of the sets F of frozen bits in the F-table reflects the changes in the shapes of the threshold voltage distributions $D_j$ that are expected to be experienced over time by the SSD device 300, and hence the aging of the SSD device 300): in other words, the selection of the current set F of frozen bits for performing polar encoding (i.e., re-encoding) and the respective storing (i.e., re-storing) during memory refresh take place analogously to action nodes 405-420 discussed above. In this way, differentiated aging of the memory blocks is avoided, and plural groups of stored encoded bits that result from encoding with respectively different sets F of frozen bits is also avoided.

In this embodiment, the refresh interval and the granularity of the F-table (i.e., the "distance" between each set F of frozen bits and the following one) are determined in the characterization phase of the SSD device 300 in such a way that, during the refresh interval, the current set F of frozen bits has to be updated at most once due to SSD device 300 aging. Therefore, according to this embodiment, at each memory refresh, upon reading the stored encoded bits, the read encoded bits are advantageously decoded based on:

the previous set F of frozen bits (i.e. the previous current set of frozen bits), if, for example, during the refresh interval, an aging of the SSD device 300 has occurred that has required the update of the current set F of frozen bits (i.e. the selection of the following set F of frozen bits from the F-table);

the current set F of frozen bits, if, for example, during the refresh interval, no update of the current set F of frozen bits has been required, whereby the resulting decoded bits are advantageously re-encoded (and subsequently re-written/re-stored) based on, respectively, the previous or current set F of frozen bits.

Back to the activity diagram 400, upon request of retrieving information bits from selected memory cells (reading request), the stored polar encoded bits are read from the selected memory cells (action node 425), thereby the set F of frozen bits used to obtain the polar encoded bits being read (i.e., the set F of frozen bits associated with the read polar encoded bits) is determined (action node 430), and the read polar encoded bits are decoded according to the associated set F of frozen bits so determined (action node 435).

In the above discussed embodiments in which an association between the addressed memory cells and the used set F of frozen bits is stored at least in the form of a n-bit index indicative of the position of the used set F of frozen bits in the F-table, the step of determining the set F of frozen bits used to obtain the polar encoded bits being read (action node 430) is advantageously achieved by retrieving the n-bit index associated with the memory cells being read, and hence the corresponding set F of frozen bits in the F-table.

Instead, in the above discussed embodiment in which, by exploiting memory refresh in cooperation with the F-table, one among the most recent (i.e., recently used) sets F of frozen bits is associated with the read encoded bits, the step of determining the set F of frozen bits used to obtain the polar encoded bits being read (action node 430) is advantageously achieved by associating the read encoded bits with:

the previous set F of frozen bits if, between the last memory refresh and the current read operation, an aging of the SSD device 300 has occurred that has required an updating of the current set F of frozen bits, i.e. the selection from the F-table of the following set (or one of the following sets) F of frozen bits as current set F of frozen bits (in that, if the following set, or one of the following sets, F of frozen bits has been selected between the last memory refresh and the current read operation, it means that the memory refresh was performed based on the "old" or previous set F of frozen bits, i.e. previous with respect to the updated (current) set F of frozen bits); or the current set F of frozen bits if, between the last memory refresh and the current read operation, no aging of the SSD device 300 has occurred that has required the updating of the set F of frozen bits, i.e. selection from the F-table of the following set F of frozen bits as current set F of frozen bits.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method for operating a solid state storage device, wherein the solid state storage device comprises a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, the method comprising:

providing a plurality of sets of frozen bits, each set of frozen bits of the plurality of sets of frozen bits being associated with a respective Raw Bit Error Rate (RBER) estimate of a plurality of RBER estimates, and each RBER estimate of the plurality of RBER estimates being estimated according to a respective shape of the threshold voltage distributions, upon request of storing information bits into selected memory cells of the plurality of memory cells:

determining a current value of at least one operative parameter of the solid state storage device affecting the shape of the threshold voltage distributions;

based on the current value of the at least one operative parameter, determining a current shape of the threshold voltage distributions;

determining, among the plurality of RBER estimates, a current RBER estimate associated with the current shape of the threshold voltage distributions;

selecting, among the plurality of sets of frozen bits, a current set of frozen bits associated with the current RBER estimate, encoding the information bits and the current set of frozen bits with a polar code, thereby obtaining polar encoded bits;

storing said polar encoded bits in the selected memory cells; and upon request of retrieving the information bits from the selected memory cells:

reading the polar encoded bits stored in the selected memory cells, and decoding the read polar encoded bits according to said current set of frozen bits.

2. The method of claim 1, wherein said at least one operative parameter of the solid state storage device affecting the threshold voltage distributions comprises a temperature indication indicative of a temperature of the solid state storage device.

3. The method of claim 1, wherein said providing a plurality of sets of frozen bits is performed during a characterization of the solid state storage device taking place during and/or after a manufacturing thereof.

4. The method of claim 1, wherein said providing a plurality of sets of frozen bits is based on the Bhattacharyya bound approximation.

5. The method of claim 1, wherein said selecting, among the plurality of sets of frozen bits, a current set of frozen bits associated with the current RBER estimate comprises selecting, among the plurality of sets of frozen bits, the set of frozen bits whose associated RBER estimate is closest in value to the current RBER estimate.

6. The method of claim 1, wherein said storing said polar encoded bits in the selected memory cells further comprises storing an association between the selected memory cells and the current set of frozen bits, and wherein said reading the polar encoded bits stored in the selected memory cells further comprises retrieving the stored association between the selected memory cells and the current set of frozen bits.

7. The method of claim 6, wherein said association between the selected memory cells and the current set of frozen bits comprises an index indicative of the current set of frozen bits among the plurality of sets of frozen bits, said storing an association between the selected memory cells and the current set of frozen bits comprising storing in the selected memory cells said index together with at least a subset of the information bits to be stored in said selected memory cells.

8. The method of claim 6, wherein said association between the selected memory cells and the current set of frozen bits comprises an index indicative of the current set of frozen bits among the plurality of sets of frozen bits, said storing an association between the selected memory cells and the current set of frozen bits comprising storing in the solid state storage device said index together with an address of the selected memory cells.

9. The method of claim 1, further comprising performing periodical memory refresh of the solid state storage device, each memory refresh comprising, for the selected memory cells:

performing a refresh reading of the polar encoded bits stored in the selected memory cells;

decoding the read polar encoded bits being read during said refresh reading thereby obtaining the respective information bits;

determining the current value of the at least one operative parameter of the solid state storage device affecting the threshold voltage distributions;

based on the current value of the at least one operative parameter, determining the current shape of the threshold voltage distributions;

determining, among the plurality of RBER estimates, the current RBER estimate associated with the current shape of the threshold voltage distributions;

selecting, among the plurality of sets of frozen bits, the current set of frozen bits associated with the current RBER estimate;

encoding the information bits and the current set of frozen bits with the polar code, thereby obtaining refreshed polar encoded bits, and storing said refreshed polar encoded bits in the selected memory cells, wherein said reading the polar encoded bits stored in the selected memory cells and said decoding the read polar encoded bits according to said current set of frozen bits upon request of retrieving the information bits from the selected memory cells, comprise:

reading the refreshed polar encoded bits stored in the selected memory cells, and decoding the read refreshed polar encoded bits according to:

the current set of frozen bits if, between a last memory refresh and said reading of the refreshed polar encoded bits, no updating of the current set of frozen bits has occurred; or a previous set of frozen bits if, between the last memory refresh and said reading of the refreshed polar encoded bits, an updating of the current set of frozen bits has occurred, the previous set of frozen bits preceding the updated current set of frozen bits.

10. The method of claim 1, wherein said at least one operative parameter of the solid state storage device affecting the threshold voltage distributions comprises a time indication indicative of a time elapsed since a last writing of the plurality of memory cells.

11. The method of claim 1, wherein said at least one operative parameter of the solid state storage device affecting the threshold voltage distributions comprises an indication of a number of program/erase cycles performed on the plurality of memory cells.

12. A controller for a solid state storage device, wherein the solid state storage device comprises a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, the controller being configured to:

store a plurality of sets of frozen bits, each set of frozen bits of the plurality of sets of frozen bits being associated with a respective Raw Bit Error Rate (RBER) estimate of a plurality of RBER estimates, and each RBER estimate of the plurality of RBER estimates being estimated according to a respective shape of the threshold voltage distributions, upon request of storing information bits into selected memory cells of the plurality of memory cells:

determine a current value of at least one operative parameter of the solid state storage device affecting the shape of the threshold voltage distributions;

based on the current value of the at least one operative parameter, determine a current shape of the threshold voltage distributions;

determine, among the plurality of RBER estimates, a current RBER estimate associated with the current shape of the threshold voltage distributions;

select, among the plurality of sets of frozen bits, a current set of frozen bits associated with the current RBER estimate, encode the information bits and the current set of frozen bits with a polar code, thereby obtaining polar encoded bits;

store said polar encoded bits in the selected memory cells; and upon request of retrieving the information bits from the selected memory cells:

read the polar encoded bits stored in the selected memory cells, and decode the read polar encoded bits according to said current set of frozen bits.

13. The controller of claim 12, wherein said at least one operative parameter of the solid state storage device affecting the threshold voltage distributions comprises a temperature indication indicative of a temperature of the solid state storage device.

14. The controller of claim 12, wherein said plurality of sets of frozen bits is stored in the controller during a characterization of the solid state storage device taking place during and/or after a manufacturing thereof.

15. The controller of claim 12, wherein said plurality of sets of frozen bits is determined based on the Bhattacharyya bound approximation.

16. The controller of claim 12, wherein the controller is configured to select, among the plurality of sets of frozen bits, a current set of frozen bits associated with the current RBER estimate by selecting, among the plurality of sets of frozen bits, the set of frozen bits whose associated RBER estimate is closest in value to the current RBER estimate.

17. The controller of claim 12, wherein the controller is configured to store said polar encoded bits in the selected memory cells by further storing an association between the selected memory cells and the current set of frozen bits, and wherein the controller is configured to read the polar encoded bits stored in the selected memory cells upon retrieving the stored association between the selected memory cells and the current set of frozen bits.

18. The controller of claim 17, wherein said association between the selected memory cells and the current set of frozen bits comprises an index indicative of the current set of frozen bits among the plurality of sets of frozen bits, the controller being configured to store in the selected memory cells said index together with at least a subset of the information bits to be stored in said selected memory cells.

19. The controller of claim 17, wherein said association between the selected memory cells and the current set of frozen bits comprises an index indicative of the current set of frozen bits among the plurality of sets of frozen bits, the controller being configured to store in the solid state storage device said index together with an address of the selected memory cells.

20. The controller of claim 12, further configured to perform periodical memory refresh of the solid state storage device, wherein each memory refresh comprises, for the selected memory cells:

performing a refresh reading of the polar encoded bits stored in the selected memory cells;

decoding the read polar encoded bits being read during said refresh reading thereby obtaining the respective information bits;

determining the current value of the at least one operative parameter of the solid state storage device affecting the threshold voltage distributions;

based on the current value of the at least one operative parameter, determining the current shape of the threshold voltage distributions;

determining, among the plurality of RBER estimates, the current RBER estimate associated with the current shape of the threshold voltage distributions;

selecting, among the plurality of sets of frozen bits, the current set of frozen bits associated with the current RBER estimate;

encoding the information bits and the current set of frozen bits with the polar code, thereby obtaining refreshed polar encoded bits, and storing said refreshed polar encoded bits in the selected memory cells, wherein the controller is configured to, upon request of retrieving the information bits from the selected memory cells:

read the refreshed polar encoded bits stored in the selected memory cells, and decode the read refreshed polar encoded bits according to:

the current set of frozen bits if, between a last memory refresh and said reading of the refreshed polar encoded bits, no updating of the current set of frozen bits has occurred; or a previous set of frozen bits if, between the last memory refresh and said reading of the refreshed polar encoded bits, an updating of the current set of frozen bits has occurred, the previous set of frozen bits preceding the updated current set of frozen bits.

21. The controller of claim 12, wherein said at least one operative parameter of the solid state storage device affecting the threshold voltage distributions comprises a time indication indicative of a time elapsed since a last writing of the plurality of memory cells.

22. The controller of claim 12, wherein said at least one operative parameter of the solid state storage device affecting the threshold voltage distributions comprises an indication of a number of program/erase cycles performed on the plurality of memory cells.

23. A solid state storage device comprising a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, the solid state storage device comprising a controller configured to:
- store a plurality of sets of frozen bits, each set of frozen bits of the plurality of sets of frozen bits being associated with a respective Raw Bit Error Rate (RBER) estimate of a plurality of RBER estimates, and each RBER estimate of the plurality of RBER estimates being estimated according to a respective shape of the threshold voltage distributions,
- upon request of storing information bits into selected memory cells of the plurality of memory cells:
- determine a current value of at least one operative parameter of the solid state storage device affecting the shape of the threshold voltage distributions;
- based on the current value of the at least one operative parameter, determine a current shape of the threshold voltage distributions;
- determine, among the plurality of RBER estimates, a current RBER estimate associated with the current shape of the threshold voltage distributions;
- select, among the plurality of sets of frozen bits, a current set of frozen bits associated with the current RBER estimate,
- encode the information bits and the current set of frozen bits with a polar code, thereby obtaining polar encoded bits;
- store said polar encoded bits in the selected memory cells; and
- upon request of retrieving the information bits from the selected memory cells:
- read the polar encoded bits stored in the selected memory cells, and
- decode the read polar encoded bits according to said current set of frozen bits.

24. The solid state storage device of claim 23, wherein said at least one operative parameter of the solid state storage device affecting the threshold voltage distributions comprises a temperature indication indicative of a temperature of the solid state storage device.

25. The solid state storage device of claim 23, wherein said plurality of sets of frozen bits is stored in the controller during a characterization of the solid state storage device taking place during and/or after a manufacturing thereof.

26. The solid state storage device of claim 23, wherein said plurality of sets of frozen bits is determined based on the Bhattacharyya bound approximation.

27. The solid state storage device of claim 23, wherein the controller is configured to select, among the plurality of sets of frozen bits, a current set of frozen bits associated with the current RBER estimate by selecting, among the plurality of sets of frozen bits, the set of frozen bits whose associated RBER estimate is closest in value to the current RBER estimate.

28. The solid state storage device of claim 23, wherein the controller is configured to store said polar encoded bits in the selected memory cells by further storing an association between the selected memory cells and the current set of frozen bits, and wherein the controller is configured to read the polar encoded bits stored in the selected memory cells upon retrieving the stored association between the selected memory cells and the current set of frozen bits.

29. The solid state storage device of claim 28, wherein said association between the selected memory cells and the current set of frozen bits comprises an index indicative of the current set of frozen bits among the plurality of sets of frozen bits, the controller being configured to store in the selected memory cells said index together with at least a subset of the information bits to be stored in said selected memory cells.

30. The solid state storage device of claim 28, wherein said association between the selected memory cells and the current set of frozen bits comprises an index indicative of the current set of frozen bits among the plurality of sets of frozen bits, the controller being configured to store in the solid state storage device said index together with an address of the selected memory cells.

31. The solid state storage device of claim 23, wherein the controller is further configured to perform periodical memory refresh of the solid state storage device, wherein each memory refresh comprises, for the selected memory cells:
- performing a refresh reading of the polar encoded bits stored in the selected memory cells;
- decoding the read polar encoded bits being read during said refresh reading thereby obtaining the respective information bits;
- determining the current value of the at least one operative parameter of the solid state storage device affecting the threshold voltage distributions;
- based on the current value of the at least one operative parameter, determining the current shape of the threshold voltage distributions;
- determining, among the plurality of RBER estimates, the current RBER estimate associated with the current shape of the threshold voltage distributions;
- selecting, among the plurality of sets of frozen bits, the current set of frozen bits associated with the current RBER estimate;
- encoding the information bits and the current set of frozen bits with the polar code, thereby obtaining refreshed polar encoded bits, and
- storing said refreshed polar encoded bits in the selected memory cells,
- wherein the controller is configured to, upon request of retrieving the information bits from the selected memory cells:
- read the refreshed polar encoded bits stored in the selected memory cells, and
- decode the read refreshed polar encoded bits according to:
  - the current set of frozen bits if, between a last memory refresh and said reading of the refreshed polar encoded bits, no updating of the current set of frozen bits has occurred; or
  - a previous set of frozen bits if, between the last memory refresh and said reading of the refreshed polar encoded bits, an updating of the current set of frozen bits has occurred, the previous set of frozen bits preceding the updated current set of frozen bits.

32. The solid state storage device of claim 23, wherein said at least one operative parameter of the solid state storage device affecting the threshold voltage distributions comprises a time indication indicative of a time elapsed since a last writing of the plurality of memory cells.

33. The solid state storage device of claim 23, wherein said at least one operative parameter of the solid state storage device affecting the threshold voltage distributions comprises an indication of a number of program/erase cycles performed on the plurality of memory cells.

* * * * *